United States Patent
Melanson

(10) Patent No.: US 7,822,214 B1
(45) Date of Patent: Oct. 26, 2010

(54) AUDIO POWER OUTPUT SYSTEM WITH SHARED OUTPUT BLOCKING CAPACITOR

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 1253 days.

(21) Appl. No.: 11/386,401

(22) Filed: Mar. 22, 2006

Related U.S. Application Data

(60) Provisional application No. 60/778,711, filed on Mar. 3, 2006.

(51) Int. Cl.
   *H03G 5/00* (2006.01)
   *H03G 11/00* (2006.01)
   *H04R 5/00* (2006.01)
   *H02B 1/00* (2006.01)

(52) U.S. Cl. .................. 381/100; 381/28; 381/55; 381/123

(58) Field of Classification Search ............ 381/100, 381/123, 55, 27, 28
   See application file for complete search history.

(56) References Cited

U.S. PATENT DOCUMENTS 4,982,435 A * 1/1991 Kato et al. ............... 381/102
6,181,796 B1 * 1/2001 Johnson ................... 381/28
2006/0023889 A1 * 2/2006 Suzaki et al. ............. 381/17

* cited by examiner

*Primary Examiner*—Xu Mei
*Assistant Examiner*—Douglas J Suthers
(74) *Attorney, Agent, or Firm*—Andrew M. Harris; Mitch Harris, Atty at Law, LLC

(57) ABSTRACT

An audio power output system with shared output blocking capacitor provides reduced cost and volume in multi-channel audio power output systems. A pair of transducers are series-connected in opposite polarity and a common DC blocking capacitor provides the return path to a power supply rail in common with a pair of audio power output stages having output terminals each connected to one of the other terminals of a corresponding transducer. A signal processing block provides a pair of signals to the inputs of the audio power output stages and process the signals to increase the separation of the audio signals at lower frequencies. The frequency-dependent characteristic of the "widening" between the signals reduces the attenuating effect of the shared capacitor and can be matched to the inverse of the narrowing effect. The signal processing block may be an analog network, or digital signal processing algorithm or circuit.

15 Claims, 3 Drawing Sheets

AUDIO POWER OUTPUT SYSTEM WITH SHARED OUTPUT BLOCKING CAPACITOR

CROSS-REFERENCE TO RELATED APPLICATION

The present application claims priority under 35 U.S.C. §119(e) to U.S. Provisional Patent Application Ser. No. 60/778,711 filed Mar. 3, 2006 by the same inventor.

BACKGROUND OF THE INVENTION

1. Field of the Invention

The present invention relates generally to multi-channel audio power output stages, and more specifically, to a circuit and method for sharing an AC blocking capacitor between two or more stages while reducing the size requirements of the blocking capacitor.

2. Background of the Invention

Audio power output stages are present in any audio rendering system that ultimately provides a signal to an audio transducer. When dual power supplies are not present or practical (i.e., when the power supply is not split), then the power stage output typically must be AC coupled through a DC blocking capacitor, so that DC currents are not generated through the transducers. Since there is no midpoint referenced return path in a single-supply amplifier system, the DC potential between the quiescent power stage output terminal voltage and either of the power supply rails is typically half of the power supply voltage.

In computer systems such as present-day personal computing devices, there are typically only uni-polar power supply outputs available, e.g., a high current 3V-5V supply and generally a lower-current 12V supply. There is a demand for audio power output stages in such systems so that separate amplifiers are not required for rendering audio produced by the computer system.

Further, in other low-cost consumer audio systems, requiring a split power supply increases the cost of the transformer and the cost of the filter bank for the power supply, or alternatively requires a bridge amplifier.

Inclusion of large DC blocking capacitors is not only costly, but consumes a significant amount of packaging volume, as in high power output stages having low-impedance transducers such as speakers, the DC blocking capacitors are typically very large, for example, aluminum electrolytic capacitors having a capacitance on the order of 2000 microfarads will yield a 3 dB corner frequency of around 20 Hz with a 4 ohm transducer. Since bass attenuation is unacceptable in most modern music applications, as well as for sound effects in video presentations, the size of the output DC blocking capacitors cannot be compromised.

Therefore, it would be desirable to provide a method and system for sharing a DC blocking capacitor among multiple audio power output stages. It would further be desirable to minimize the size of the DC blocking capacitor required in power amplifiers operated from a single power supply output.

SUMMARY OF THE INVENTION

The above stated objectives of sharing a DC blocking capacitor among multiple audio power output stages and reducing the size requirements of the blocking capacitor is achieved in a method and system. The method is a method of operation of the system, which is an audio power output system that may include digital signal processing algorithms executed on a dedicated digital signal processor or within a general-purpose computing system.

The system includes a pair of transducers that are series-connected in opposite polarity and a DC blocking capacitor coupling their commonly connected terminals to one of the power supply rails supplying a pair of audio power output stages. The outputs of the audio power output stages are each coupled to one of the other terminals of the transducers. A signal processing block having outputs coupled to the inputs of the audio power stages increases the separation of lower-frequency audio difference information between the input signals to the pair of audio power output stages, compensating for the loss of bass frequency content due to sharing the DC blocking capacitor between the stages. The frequency-dependent characteristic of the "widening" of the low-frequency audio information can be specifically tailored to match the inverse of the bass attenuating effect of the shared capacitor.

The signal processing block may be an analog network, dedicated digital filter circuit or may be an algorithm performed in a dedicated digital signal processor or within a computer system providing a digital or analog output source to the inputs of the audio power output stages.

The signal processing block may include signal level detection and compression circuitry or algorithms that reduce the amount of widening effect as audio volume level increases to avoid reduction of program headroom introduced by the widening. Alternatively, or in combination, control of the amount of low-frequency difference signal applied to the output stages can be controlled in inverse proportion to a volume control setting.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses a system and method of operation that share a common DC blocking capacitor for a single-supply multi-channel audio power output stage. The capacitance of the shared capacitor can be reduced via signal processing that increases the differences between the channel audio outputs at low frequencies, so that the impact of the attenuation of non-difference bass frequencies due to the increased impedance of the common return path from the transducers is reduced in the perception of the listener. The widening is accomplished by either a dedicated analog or digital signal processing block that enhances the differences in the bass signals at low frequencies, or via a dedicated or general-purpose processing system that pre-processes the audio signal supplied to the power output stages.

Figure 1:
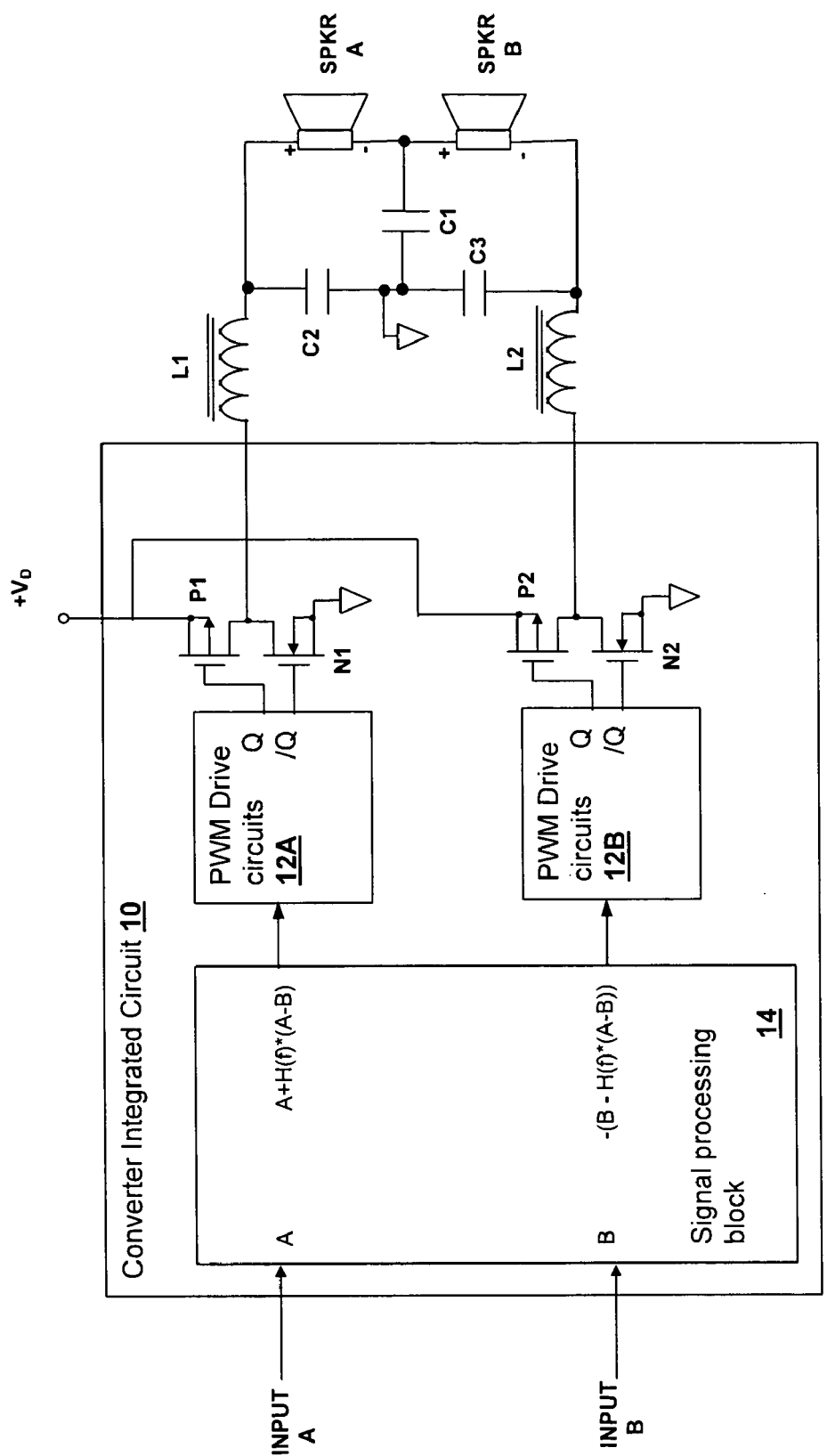
FIG. 1 is a simplified schematic diagram depicting a system in accordance with an embodiment of the invention.

Referring now to the figures, and in particular to FIG. 1, an audio reproduction system in accordance with an embodiment of the present invention is depicted. A converter integrated circuit 10 includes a pair of single-ended half-bridge audio outputs formed by transistors N1,P1 and N2,P2 that provide switching pulse-width modulated output signals to exemplary loads, speakers SPKR A-B, through LC filters comprising inductors L1, L2 and associated capacitors C2, C3. A DC blocking capacitor C1 isolates speakers SPKR A-B from the DC value at the output terminal of converter integrated circuit which is ideally at the midpoint voltage of the power supply rails supplied to converter integrated circuit 10.

Transistors N1,P1 and N2,P2 are controlled by corresponding pulse width modulation (PWM) drive circuits 12A-B that periodically and alternatively pulse one of transistors N1,P1 on (one of transistors N2,P2 for the SPKR B channel) to provide bipolar pulsed outputs at the output terminals of converter integrated circuit 10 that are connected to inductors L1 and L2. The filters provided by inductor L1 and capacitor C2, and inductor L2 and capacitor C3 smooth the pulsed signals into the desired AC waveforms, which are generally amplified replicas of the AC input signals being amplified as provided at inputs to converter integrated circuit 10. However, the techniques of the present invention can be applied to any multi-channel audio power output stage where DC output blocking is employed.

However, at low frequencies, a signal processing block 14 that pre-processes the audio input signals INPUT A and INPUT B operates to increase the difference between input signals INPUT A and INPUT B in order to overcome the bass attenuating effect of capacitor C1. As depicted, the outputs of signal processing block 14, which may be an analog network or digital processing block such as a dedicated circuit or digital signal processor (DSP) executing an algorithm, are expressed as: A+H(f)*(A−B) and −(B−H(f)*(A−B)).

H(f) is a low-pass transfer function, which means H(f) is large at low frequencies and small at high frequencies. Therefore at high frequencies, the outputs provided to PWM drive circuits 12A, 12B are A and B. However, at low frequencies, the outputs will be, for example, 2A−B and −(2B−A), effectively increasing the difference elements present in each channel. (Mono bass elements are essentially unaffected.) However, for practical purposes, H(f) is actually implemented as a low-boost shelving filter, so that very low frequencies approaching DC are not overly boosted. For example, if the corner frequency caused by capacitor C1 is set to 80 Hz, the shelf of the low-pass filter may end at some point between 20 Hz and 40 Hz, with 6 dB to 12 dB of resulting maximum gain. The result is that the bass frequencies will still be enhanced without adversely affecting performance of the system. If capacitor C1 were removed from the circuit, at the very low bass frequencies, the series combination of speakers would receive a total (differential) signal corresponding to A+B, but since capacitor C1 is still present, just with a higher relative impedance, SPKR A will have a portion of the INPUT A bass signal and a portion of the difference between INPUT A and INPUT B, as will SPKR B have a corresponding portion of the INPUT B bass signal and a portion of the difference between INPUT B and INPUT A. The result is a "widening" of the bass component of the overall stereo output that helps overcome the effect of the increased impedance of capacitor C1 at lower frequencies. The finite value of capacitor C1 causes a narrowing of low frequencies. If the speaker impedance is modeled as a resistance R, the corner frequency of the narrowing is $2/2pRC_1$. For example, if R=4 Ohm and C1=1000 μF, the corner frequency is approximately 80 Hz, indicating that at 80 Hz, the separation is reduced by 3 dB.

Transfer function H(f) is produced by one or more filters per channel in digital signal processing block 14 and ideally represents the inverse of the attenuation due to capacitor C1. Transfer function H(f) can be calculated from the impedance of the entire output network, which includes capacitor C1, SPKR A, SPKR B (which are ideally identical) and to some degree the filter components L1, L2, C2 and C3, although generally the filters will have little effect for values of C1 large enough to support a reasonably low impedance at bass frequencies. The filter networks formed by L1, L2, C2 and C3 must generally be high enough in corner frequency to pass the highest frequency of interest in the audio spectrum and generally have a corner frequency of approximately 25 kHz.

At low frequencies, most audio source material contains little channel separation. Additionally, the ear has little directionality at low frequencies. By arranging the channels out of phase, the primary low frequency information, which is mono, is reproduced just as if capacitor C1 were of infinite capacitance. The slight degradation in separation at lower frequencies due to the finite value of capacitor C1 can be compensated for by the above-described network by all but the highest volume signals. The system of the present invention therefore provides a significant cost and space savings, while making only minor sacrifices in quality.

Figure 2:
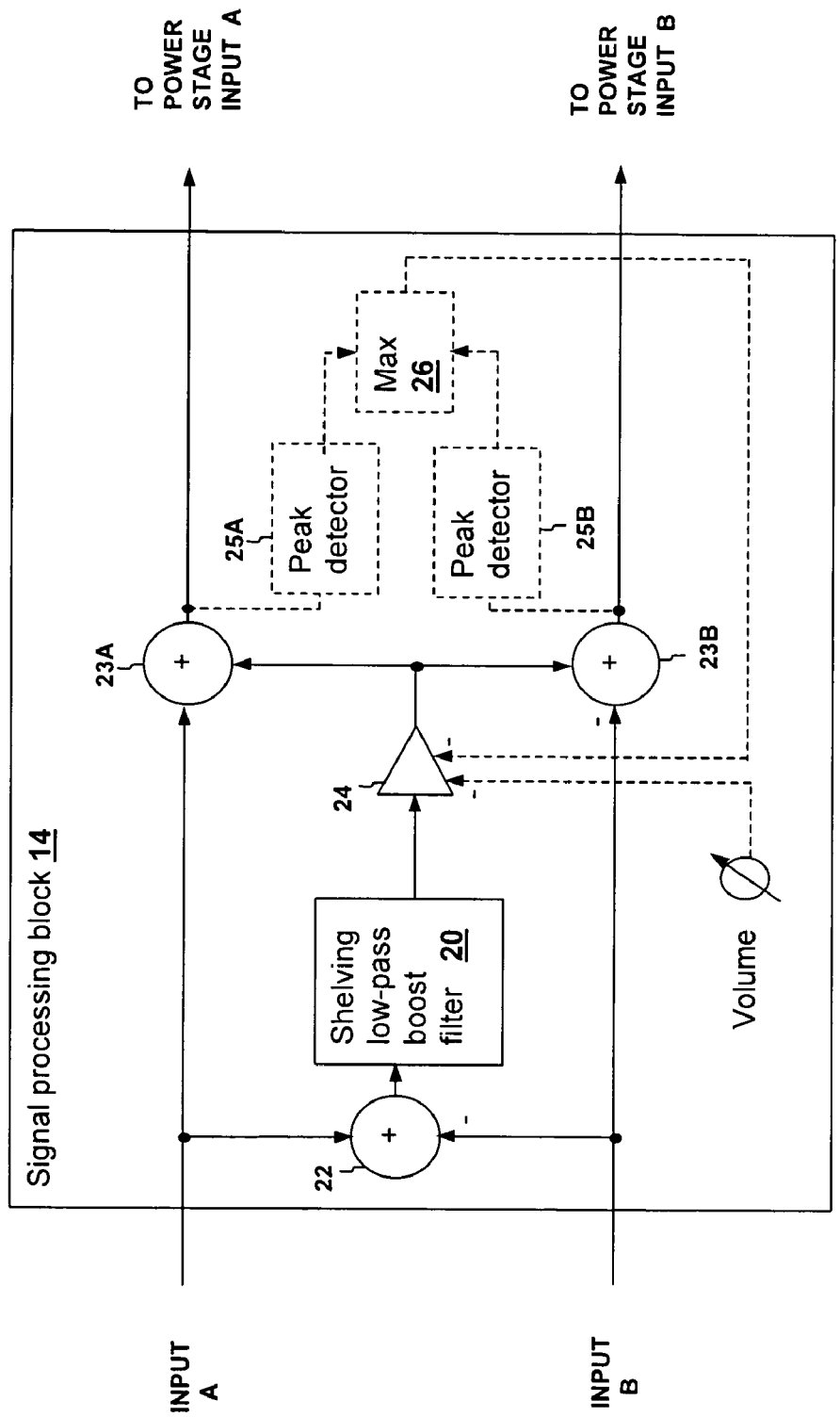
FIG. 2 is a simplified schematic diagram depicting details of an embodiment of signal processing block 14 as may be employed in the system of FIG. 1.

Referring now to FIG. 2, an exemplary signal processing block 14 as may be employed in the system of FIG. 1, is depicted. A combiner 22 generates a signal corresponding to the differences between the signals provided at audio inputs INPUT A and INPUT B and a shelving low-pass boost filter 20 extracts low frequency information from the difference. Low-pass boost filter 20 may have a transfer function roll-off matched to the inverse of the frequency dependent bass attenuation caused by the impedance of capacitor C1 for some range of frequencies below the corner frequency due to the presence of capacitor C1. The resulting low-frequency difference signal is adjusted in amplitude by gain control/multiplier 24 and applied to combiners 23A and 23B that provide the output signals to the power stages, along with the direct signals from INPUT A and INPUT B. The direct signal for INPUT B is inverted via an input to combiner 23B that is inverted with respect to the output of combiner 23B to correct for the inverted polarity of SPKR B with respect to SPRK A. However the inversion of the B channel audio can be accomplished anywhere in the signal path as long as the proper relationship between the low-frequency difference signal and the INPUT B signal is maintained at SPKR B.

The amount of difference signal added to the direct signals that is set by gain control/multiplier 24 is determined either by an input from the volume control circuit or via a signal level detection block that includes peak detectors 25A, 25B and a maximum detector block 26. The amount of low-frequency difference signal applied to the power stages is reduced as either the volume control level is increased or as the maximum peak level from the output of combiners 23A and 23B increases, so that the addition of the low-frequency difference signal does not cause clipping distortion in the reproduced audio. Since much modern popular music does not have much dynamic range, adjusting via the volume control will generally provide sufficient control, since for music having low dynamic range, the peak signal level will closely track the volume control setting.

Figure 3:
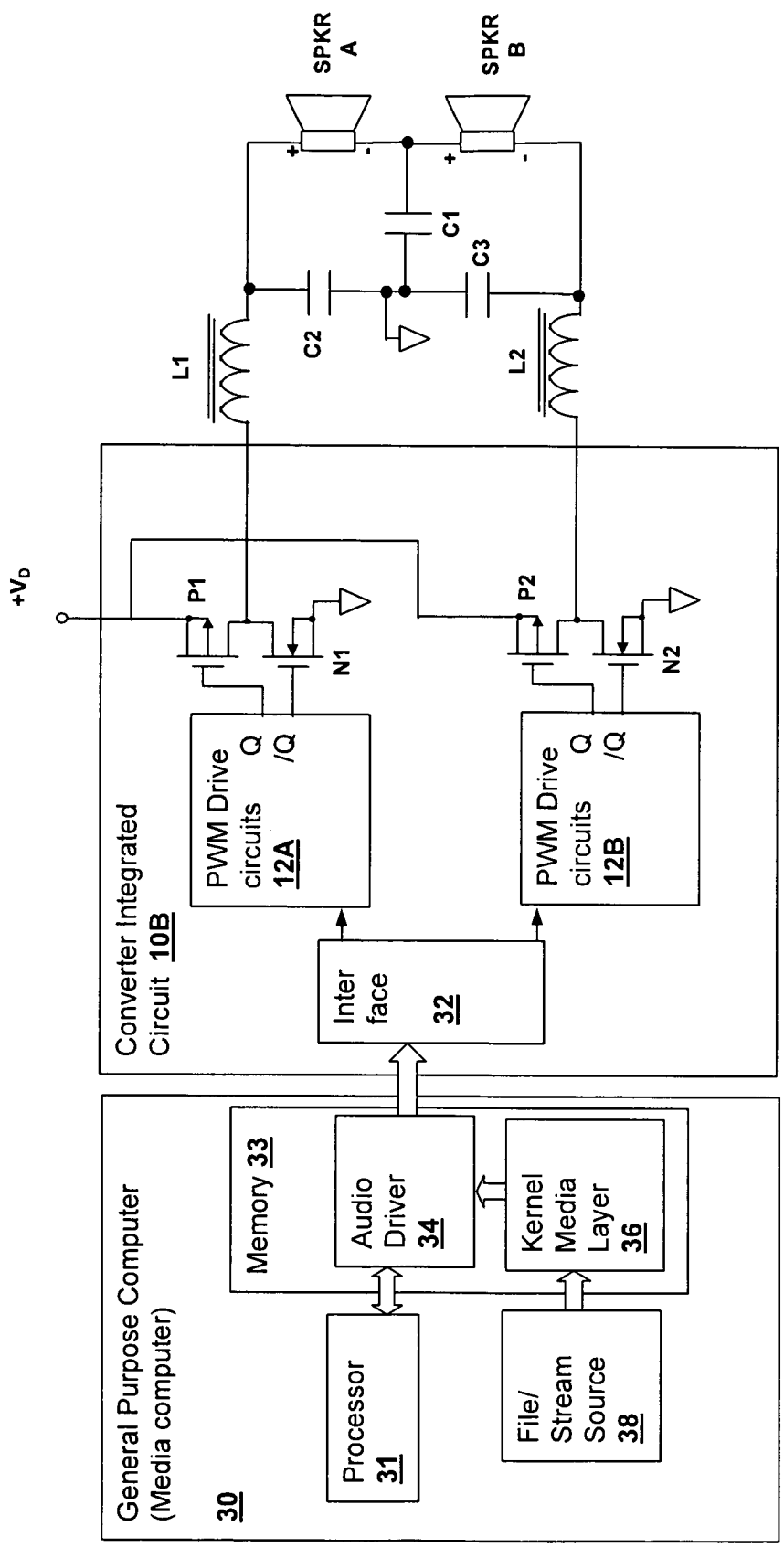
FIG. 3 is a block depicting a system in accordance with another embodiment of the invention.

Referring now to FIG. 3, an audio reproduction system in accordance with another embodiment of the invention is depicted. The circuit of FIG. 3 is also similar to that of FIG. 1, and therefore only differences between them will be described below. Rather than include signal processing block 14 within the converter integrated circuit 10B, in the depicted system, converter integrated circuit renders signals provided through an interface 32 from a general-purpose computer 30, which may be a computer designated and designed as a media computer. Interface 32 may be an analog signal connection or digital interface, such as an optical TOSLINK connector having an S/P-DIF stereo optical signal.

General-purpose computer 30 includes a processor 31 for executing program instructions and a memory 33 for storing the program instructions, wherein the program instructions are for carrying out the bass widening method of the present invention. The program instructions may form part of the operating system executed by general-purpose computer 30, or as an add-on driver or plug-in. As illustrated, the program instructions/operating system include a kernel media layer 36 and an audio driver 34. Audio drive 34 provides the audio information to interface 32 from kernel media layer 36 and either module may include an algorithm that performs computations effecting the above-described bass widening. The audio is generally provided from a file or stream source 38, but may also include other analog or digital sources within or external to general-purpose computer system 30. The widening algorithm may be just as described with respect to FIG. 2, with kernel media layer 36 or audio driver 34 computing values corresponding to high-pass filtered and low pass filtered audio for each channel, performing summations and subtractions to obtain the difference information, detecting signal levels at each of the two channel outputs and adjusting the relative amounts of difference information and direct low-frequency channel information provided to interface 32.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. An audio reproduction circuit comprising:
   a pair of channel power driver stages each having a corresponding channel driver output;
   a stereo transducer circuit having first and second transducers for transforming associated channel electrical signals to audible sound, wherein said first and second transducers are connected in series by commonly connected terminals of opposing polarity, and wherein the commonly connected terminals are further coupled through a capacitor to a DC supply point of said pair of power driver stages; and
   a pair of audio signal processing circuits, each associated with one of said pair of channel power driver stages and having an output coupled to an input of the associated channel power driver stage and an input for receiving a corresponding one of a pair of channel signals, wherein said audio signal processing circuits increase a difference between said pair of corresponding channel signals and provide signals with said increased difference to said channel power driver stages, wherein said pair of audio signal processing circuits increase said difference more for lower-frequency components of said corresponding channel signals than for higher-frequency components of said corresponding channel signals, according to a frequency-dependent characteristic of said difference increase, and wherein said frequency-dependent characteristic is substantially equal to an inverse of a frequency-dependent reduction in a separation of said associated channel electrical signals rendered by said first and second transducers due to a frequency-dependent impedance of said capacitor.

2. The audio reproduction circuit of claim 1, wherein said difference increase is further dependent on a detected level of at least one of said outputs of said audio signal processing circuits, wherein said difference increase is reduced as said detected level increases.

3. The audio reproduction circuit of claim 1, wherein said difference increase is further dependent on a detected level of at least one of said outputs of said audio signal processing circuits, wherein said difference increase is reduced as said detected level increases.

4. The audio reproduction circuit of claim 3, wherein said detected level is a maximum peak level among both of said outputs of said audio signal processing circuits.

5. The audio reproduction circuit of claim 1, wherein said difference increase is further dependent on an inverse of a level of a volume control controlling a gain of said pair of channel signals.

6. A method for processing audio for delivery to a pair of channel power driver stages each having a corresponding channel driver output, wherein said power driver stages are coupled to a stereo transducer circuit having first and second transducers for transforming associated channel electrical signals to audible sound, wherein said first and second transducers are connected in series by commonly connected terminals of opposing polarity, and wherein the commonly connected terminals are further coupled through a capacitor to a DC supply point of said pair of power driver stages, wherein said method comprises:
   receiving a first and second audio input signal;
   first low-pass filtering said first audio input signal;
   second low-pass filtering said second audio input signal;
   subtracting a result of said first low-pass filtering from a result of said second low-pass filtering to generate a low-frequency difference signal;
   first combining said low-frequency difference signal with said first audio input signal to provide an input to a first one of said channel power driver stages; and
   second combining said low-frequency difference signal with said second audio signal to provide an input to a second one of said channel power driver stages, wherein an attenuation at low frequency caused by said capacitor is reduced in effect on outputs of said first and second transducers, and wherein a frequency-dependent characteristic of said low-pass filtering is matched to an inverse of a frequency-dependent characteristic of said attenuation caused by said capacitor.

7. The method of claim 6, wherein said first combining and said second combining combine a portion of said low-frequency difference that is controlled in conformity with a program level of said first and second audio input signal.

8. The method of claim 7, further comprising:
   first detecting a peak level of a result of said first combining; and
   second detecting a peak level of a result of said second combining, and wherein said portion of said low-frequency difference is controlled in conformity with a sum of a result of said first and second detecting, wherein said portion is decreased for greater detected levels of said results of said first and second combining.

9. The method of claim 6, wherein said first combining and said second combining combine a portion of said low-frequency difference that is controlled in conformity with a volume control that controls a program level of said first and second audio input signal.

10. A computer system, comprising:
    a processor for executing program instructions; and
    a memory for storing said program instructions, wherein said program instructions are program instructions for processing audio for delivery to a pair of channel power driver stages each having a corresponding channel driver output, wherein said power driver stages are coupled to a stereo transducer circuit having first and second transducers for transforming associated channel electrical signals to audible sound, wherein said first and second transducers are connected in series by commonly connected terminals of opposing polarity, and wherein the commonly connected terminals are further coupled through a capacitor to a DC supply point of said pair of power driver stages, wherein said program instructions further comprise program instructions for:

receiving a first and second audio input signal;

first low-pass filtering said first audio input signal;

second low-pass filtering said second audio input signal;

subtracting a result of said first low-pass filtering from a result of said second low-pass filtering to generate a low-frequency difference signal;

first combining said low-frequency difference signal with said first audio input signal to provide an input to a first one of said channel power driver stages; and second combining said low-frequency difference signal with said second audio signal to provide an input to a first one of said channel power driver stages, wherein an attenuation at low frequency caused by said capacitor is reduced in effect on outputs of said first and second transducers, and wherein a frequency-dependent characteristic of said low-pass filtering is matched to an inverse of a frequency-dependent characteristic of said attenuation caused by said capacitor.

11. The computer system of claim 10, wherein said program instructions for first combining and second combining combine a portion of said low-frequency difference that is controlled in conformity with a program level of said first and second audio input signal.

12. The computer system of claim 11, wherein said program instructions further comprise program instructions for:

first detecting a peak level of a result of said first combining; and second detecting a peak level of a result of said second combining, and wherein said portion of said low-frequency difference is controlled in conformity with a sum of a result of said first and second detecting, wherein said portion is decreased for greater detected levels of said results of said first and second combining.

13. A computer program product comprising a tangible computer readable storage medium storing encoding program instructions for execution within a general-purpose computer system, said program instructions comprising program instructions for processing audio for delivery to a pair of channel power driver stages each having a corresponding channel driver output, wherein said power driver stages are coupled to a stereo transducer circuit having first and second transducers for transforming associated channel electrical signals to audible sound, wherein said first and second transducers are connected in series by commonly connected terminals of opposing polarity, and wherein the commonly connected terminals are further coupled through a capacitor to a DC supply point of said pair of power driver stages, wherein said program instructions further comprise program instructions for:

receiving a first and second audio input signal;

first low-pass filtering said first audio input signal;

second low-pass filtering said second audio input signal;

subtracting a result of said first low-pass filtering from a result of said second low-pass filtering to generate a low-frequency difference signal;

first combining said low-frequency difference signal with said first audio input signal to provide an input to a first one of said channel power driver stages; and second combining said low-frequency difference signal with said second audio signal to provide an input to a first one of said channel power driver stages, wherein an attenuation at low frequency caused by said capacitor is reduced in effect on outputs of said first and second transducers, and wherein a frequency-dependent characteristic of said low-pass filtering is matched to an inverse of a frequency-dependent characteristic of said attenuation caused by said capacitor.

14. An audio reproduction circuit comprising:

a pair of channel power driver stages each having a corresponding channel driver output;

a stereo transducer circuit having first and second transducers for transforming associated channel electrical signals to audible sound, wherein said first and second transducers are connected in series by commonly connected terminals of opposing polarity, and wherein the commonly connected terminals are further coupled through a capacitor to a DC supply point of said pair of power driver stages; and a pair of audio signal processing circuits, each associated with one of said pair of channel power driver stages and having an output coupled to an input of the associated channel power driver stage and an input for receiving a corresponding one of a pair of channel signals, wherein said audio signal processing circuits increase a difference between said pair of corresponding channel signals relative to the amplitude of the pair of corresponding channel signals, and provide signals with said increased difference to said channel power driver stages, wherein said pair of audio signal processing circuits increase said difference more for lower-frequency components of said corresponding channel signals than for higher-frequency components of said corresponding channel signals, according to a frequency-dependent characteristic of said difference increase, and wherein the audio signal processing circuits increase the difference less with increases in the amplitude of the pair of channel signals, whereby at higher levels of the amplitude of the pair of channel signals, the increase of said difference is prevented from causing clipping in the pair of channel power driver stages.

15. A method for processing audio for delivery to a pair of channel power driver stages each having a corresponding channel driver output, wherein said power driver stages are coupled to a stereo transducer circuit having first and second transducers for transforming associated channel electrical signals to audible sound, wherein said first and second transducers are connected in series by commonly connected terminals of opposing polarity, and wherein the commonly connected terminals are further coupled through a capacitor to a DC supply point of said pair of power driver stages, wherein said method comprises:

receiving a first and second audio input signal;

first low-pass filtering said first audio input signal;

second low-pass filtering said second audio input signal;

subtracting a result of said first low-pass filtering and said second low-pass filtering to generate a low-frequency difference signal;

first combining said low-frequency difference signal with said first audio input signal to provide an input to a first one of said channel power driver stages;

second combining said low-frequency difference signal with said second audio signal to provide an input to a first one of said channel power driver stages, wherein an attenuation at low frequency caused by said capacitor is reduced in effect on outputs of said first and second transducers; and wherein said first combining and said second combining combine a portion of said low-frequency difference that has an amplitude relative to and controlled in conformity with a program level of said first and second audio input signal, whereby at higher levels of the program level of the first and second audio signals, the relative amount of low frequency difference is reduced to prevent the first and second combining of the low-frequency difference signal is prevented from causing clipping in the pair of channel power driver stages.

\* \* \* \* \*